United States Patent [19]
White et al.

[11] Patent Number: 5,448,311
[45] Date of Patent: Sep. 5, 1995

[54] TRI-STATE VIDEO DIFFERENTIAL DRIVER

[75] Inventors: Charles M. White, Noblesville; William A. Lagoni, Indianapolis, both of Ind.

[73] Assignee: Thomson Consumer Electronics, Inc., Indianapolis, Ind.

[21] Appl. No.: 294,146

[22] Filed: Aug. 22, 1994

[51] Int. Cl.$^6$ .............................................. H04N 5/14
[52] U.S. Cl. .................... 348/707; 348/706; 330/254
[58] Field of Search ............... 348/707, 706, 725, 678; 358/184; H04N 5/14; 330/254, 261

[56] References Cited

U.S. PATENT DOCUMENTS

| | | | |
|---|---|---|---|
| 4,575,759 | 3/1986 | Griepentrog et al. | 358/181 |
| 4,581,645 | 4/1986 | Beyers, Jr. | 358/181 |
| 4,647,973 | 3/1987 | Diess | 358/181 |
| 5,305,109 | 4/1994 | Harford | 348/707 |

*Primary Examiner*—James J. Groody
*Assistant Examiner*—Sherrie Hsia
*Attorney, Agent, or Firm*—Joseph S. Tripoli; Peter M. Emanuel; Richard G. Coalter

[57] ABSTRACT

A differential current source (50) provides first and second complementary output currents (I1, I2) responsive to a video input signal (S1) which are coupled via respective load networks (52,54) to a common supply terminal (22) and develop first and second complementary video output signals (V1,V2). A first output circuit (56) applies the first output signal to a first output terminal (16) via a voltage follower transistor (Q6) and applies the second output signal to the first output terminal via a current source transistor (Q8). A second output terminal (18) is similarly driven by a second voltage follower transistor (Q5) and a second current source transistor (Q7), all transistors being of the same conductivity type. A tri-state control circuit (Q1,Q2) coupled to the differential current source enables the differential current source in a first operating mode to produce the first and second complementary currents whereby push pull output signals are produced at the output terminals. In a second operating mode, the tri-state control circuit forces the complementary currents to zero whereby the common supply terminal (22) applies turn-off bias via the two load networks to the control electrodes of all of the output transistors thereby "tri-stating" (isolating) the output terminals. Advantageously, in the tri-state mode, there is zero quiescent power dissipation in the output circuits, the load networks, the differential current source and the tri-state control circuit.

10 Claims, 4 Drawing Sheets

TRI-STATE VIDEO DIFFERENTIAL DRIVER

FIELD OF THE INVENTION

This invention relates to video interconnection systems generally and particularly to baseband video driver amplifiers for providing tri-state drive signals to a video bus.

BACKGROUND OF THE INVENTION

Bus oriented bi-directional video interconnection systems are known and used, for example, for interconnecting component video apparatus such as video tape recorders, video disc players, television tuners, video cameras, video monitors and so forth. Such applications require the ability of the driver to apply video signals to the bus with a relatively low source or sink impedance and to isolate video signals from the bus with a relatively high "off state" impedance. Such a characteristic is called a "tri-state" operation because of the three possible drive conditions of (1) supplying or "sourcing" current to the bus with a low impedance, (2) removing or "sinking" current from the bus with a low impedance and (3) isolating or de-coupling the video signal from the bus with a very high impedance, essentially an open circuit.

One may achieve such tri-state operation by coupling the output of a video driver to a bus by means of a mechanical relay. Mechanical relays have excellent electrical characteristics for this purpose in terms of on and off impedances but are relatively expensive and may be relatively bulky, unreliable and slow. Solid state switches, such as transmission gates, may be used for selectively coupling video signals to a bus but typically exhibit a relatively high "on" resistance and the "on" resistance may also vary with signal levels thus introducing undesirable signal distortions.

One solution to the problem of providing tri-state operation which overcomes the problem of poor "on-state" characteristics of solid state switches is described by Beyers, Jr. in U.S. Pat. No. 4,581,645 entitled DISTRIBUTED SWITCHED COMPONENT AUDIO/VIDEO SYSTEM which issued Apr. 8, 1986. In an exemplary driver amplifier therein described, video coupling to a bus is provided by means of a PIN diode. As explained by Beyers, Jr., such diodes have excellent isolation characteristics at video frequencies but have relatively poor "on-state" impedance characteristics (e.g., a relatively high and variable impedance when biased "on"). Beyers solved the problem for PIN diode switches by incorporating the PIN switching diode in a negative feedback path with the driver amplifier. The negative feedback is applied when the diode is biased "on" and effectively reduces and stabilizes the on-state diode resistance when coupling video signals to the bus. Provisions are made for applying reverse DC bias to the diode when isolating the video signals from the bus. However, the use of special switching diodes (PIN diodes) and the application of negative feedback to the diode results in a relatively complex switching circuit.

SUMMARY OF THE INVENTION

The examples above relate to so-called "single-ended" tri-state applications. In certain applications it would be desirable to provide balanced tri-state operation to obtain the advantages of improved common mode rejection afforded by balanced operation.

It is herein recognized that a need exists for a simplified tri-state video bus driver providing balanced line drive capability and which does not require either special switching diodes or the use of negative feedback to overcome the relatively poor on-state impedance characteristics. A need further exists, for reduced quiescent power dissipation when the driver is in its stand-by or tri-state mode. The present invention is directed to meeting those needs.

A method of providing tri-state balanced-line video bus drive, in accordance with the invention, comprises deriving first and second complementary currents from a video input signal; developing a first signal in a first load circuit from the first current and a complementary second signal in a second load circuit from the second current; applying the first signal to first output terminal via a voltage follower transistor and to a second output terminal via a current source transistor; applying the second signal to the second output terminal via a second voltage follower transistor and to the first output terminal via a second current source transistor; enabling the first and second complementary currents whereby said first, second, third and fourth transistors produce push-pull output signals at the output terminals; and disabling the first and second complementary currents for applying turn-off bias to the first, second, third and fourth transistors via the load circuits so as to isolate the output terminals.

Apparatus, for providing tri-state balanced video bus drive, in accordance with the invention, comprises a differential current source for deriving first and second complementary currents from a video input signal and a load network for developing a first output signal in a first load circuit from the first current and for developing a second output signal in a second load circuit from the second current. A first output circuit applies the first output signal to first output terminal (16) via a voltage follower transistor and to a second output terminal via a current source transistor and a second output circuit applies the second output signal to the second output terminal via a second voltage follower transistor and to the first output terminal via a second current source transistor. A tri-state control circuit, responsive to a first level of a control signal supplied thereto, enables the differential current source to produce the first and second complementary currents whereby push pull output signals are produced at the output terminals. The tri-state control circuit is responsive to a second level of the control signal for inhibiting the differential current source from producing the first and second complementary currents so as to enable the load circuits apply turn-off bias to the first, second, third and fourth transistors for tri-stating (isolating) the output terminals.

BRIEF DESCRIPTION OF THE DRAWING

The foregoing and further features of the invention are illustrated in the accompanying drawing, wherein like elements are denoted by like reference designators, and in which.

DETAILED DESCRIPTION

Figure 1:
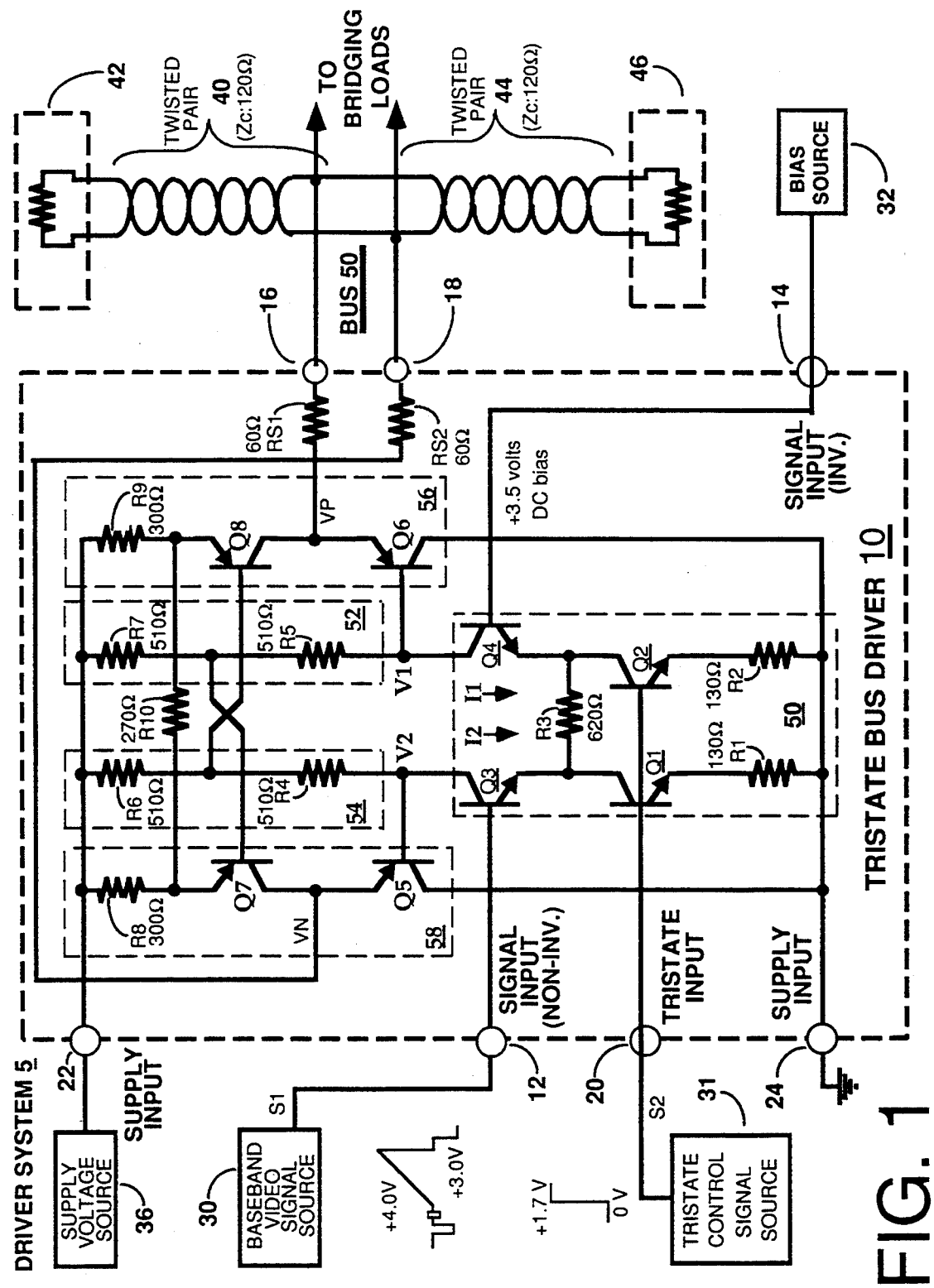
FIG. 1 is a block diagram, partially in schematic form, of a tri-state balanced line video bus driver system embodying the invention.

The tri-state balanced-line video driver system 5 of FIG. 1 provides distribution of video signals via twisted pair lines to various load devices including terminating loads and bridging loads. A "terminating" load, as used herein, means a load having a resistive component equal to the characteristic impedance of the distribution twisted pair line (in this example, 120 Ohms) and a bridging load means a load having an input impedance substantially in excess of the line characteristic impedance (e.g., ten times 120 Ohms or more).

The driver system 5 includes a tri-state bus driver 10, having a pair of supply terminals 22 and 24, a pair of input signal terminals 12 and 14, a tri-state control terminal 20 and a pair of video signal output terminals 16 and 18. The supply terminals 22 and 24 are coupled to a source of supply voltage 36 (e.g., +12 volts) and to ground, respectively. The signal terminals 12 and 14 are coupled, respectively, in this example of the invention, to a baseband video signal source 30 for receiving a baseband video input signal S1 and to a bias source 32, for receiving a bias voltage (e.g., +3.5 volts DC bias, in this example of the invention). This source configuration is for applications where the video source is "single ended". (Later, in FIG. 3, an example will be given for differential video sources). The tri-state control terminal 20 is coupled to a tri-state control signal source 31 which provides a tri-state control signal S2 which, in this example of the invention, varies between zero volts (for tri-state operation in which the output terminals are isolated) to a positive value (e.g., 1.7 volts, in this example) which enables normal push-pull operation of the driver circuit.

The output terminals 16 and 18 provide balanced line drive to a bus 50 when the tri-state control signal is high (+1.7 volts) and are isolated from bus 50 when the tri-state control signal is low (e.g., ground). The bus 50 is distributed to loads via twisted pair lines (e.g., 40, 44) having a characteristic impedance of 120 Ohms. The system is designed to drive a pair of terminating loads 42 and 46 having a resistive ("real") component of input impedance equal to the twisted pair line characteristic impedance of 120 Ohms and a number of so-called "bridging loads" having a real component of input impedance substantially in excess of 120 Ohms.

The loads may comprise, illustratively, television display devices, video cassette recorders, video monitors, video tape recorders or the like. Some may be of high impedance (bridging) and two are of low impedance (i.e., equal to the characteristic impedance of the twisted pair lines of 120 Ohms).

Advantageously, the use of twisted pair lines for video distribution can provide a very low level of line radiation. Also, interconnection of twisted pair lines for "daisy chaining" may be simpler, from a connector standpoint, than for coaxial lines and may be of potentially lower cost.

Considering now the details of the tri-state bus driver 10 (outlined in phantom) there are provided: a differential current source 51 (outlined in phantom); a pair of load networks 52 and 54 (outlined in phantom); and a pair of output circuits 56 and 58 (outlined in phantom). As will be explained in detail later, it is a particular advantage of this embodiment of the invention that when in the tri-state mode (1) there is zero quiescent power dissipation in the output circuits, (2) there is zero quiescent power dissipation in the load circuits, (3) there is also zero quiescent power dissipation in the differential current source and (4) there is zero quiescent power dissipation in the tri-state control circuitry.

One function of the differential current source 51 is for deriving first and second complementary currents (I1,I2) from the video input signal (S1) during normal operation of the bus driver 10. Another function is to force the output currents (I1 and I2) to zero during tri-state operation which, as will be explained, enables the load networks 52 and 54 to bias all four of the output transistors of the driver 10 OFF thereby isolating the circuit output terminals.

Advantageously, isolation or "tri-stating" of the bus 50 allows two way communication of video signals along the bus as previously discussed. In more detail, if there are a number of video sources, and all have tri-state capability, then any source may take "control" of the bus for distributing its video signal to the utilization video components while the un-selected sources disconnect themselves from the bus so as to not interfere with the operation of the selected video bus driving source. Such an arrangement has great flexibility and is particularly needed to provide flexibility in the developing "information highway" of modern video related equipment including computers, tele-conferenceing, cable distribution and other video services.

A suitable circuit implementation of the differential current source 51, in this specific example of the invention, includes providing a pair of NPN transistors Q1 and Q2 having base electrodes coupled to the tri-state input terminal 20, having emitter electrodes coupled to supply terminal 24 (ground) via respective resistors R1 and R2 and having respective collector electrodes coupled together via a resistor R3 and to respective emitter electrodes of differential amplifier transistors Q3 and Q4. The differential amplifier transistors Q3 and Q4 have respective base electrodes coupled to respective signal input terminals 12 and 14 and have respective collector electrodes for providing the complementary output currents I1 (from transistor Q4) and I2 (from transistor Q3).

Transistors Q3 and Q4 simply provide differential amplification of the input signals applied to the input terminals 12 and 14. Transistors Q1 and Q2 of driver 10, however, provide dual functions. One function, during normal operation of the driver 10, is of establishing the quiescent operating current level for the differential amplifier (emitter coupled) transistors Q3 and Q4. The quiescent current is determined by the value of the bias applied to terminal 20 and the values of resistors R1 and R2. The other function, during tri-state operation, is to force the differential amplifier output currents to zero for facilitating decoupling of the driver circuits from the output terminals. The cross-coupling resistor R3 connected between the emitters of the differential amplifier transistors Q3 and Q4 provides a gain determining function. Increasing this value decreases the gain of driver 10 and vice versa.

As noted above, driver 10 includes a pair of load networks. The first load network 52 (outlined in phantom) develops a signal V1 from the first current I1 which is in-phase with the video signal applied to input terminal 12 and a second load network 54 (outlined in phantom) develops a signal (V2) from the second current I2 which is out-of-phase with the video signal applied to terminal 12. Specifically, the first load network 52 comprises a pair of resistors R5 and R7 coupled from the collector of transistor Q4 to supply terminal 22. (For the representative resistor values given and the transistor types illustrated, an exemplary supply voltage is +12 volts.) The second load network 54 comprises a pair of resistors R4 and R6 coupled from the collector of transistor Q3 to the supply terminal 22. As will be explained in detail later, these two load networks bias four transistors (Q5–Q8) to provide push pull (balanced) output signals at output terminals 16 and 18 when the currents I1 and I2 are present. When these currents are inhibited as discussed above (i.e., zero valued), the two load networks provide a different function of clamping the control electrodes (bases) of the four output transistors (Q5–Q8) to the positive supply terminal 22 thereby biasing all the transistors OFF and thus isolating the output terminals 16 and 18 from the driver transistors (i.e., "tri-stating" the outputs).

Driver 10 further comprises a pair of output circuits 56 and 58 (outlined in phantom). The first output circuit 56 applies the in-phase signal V1 to first output terminal 16 via a voltage follower transistor Q6 and applies the out of phase signal V2 to the first output terminal via a current source transistor Q8. The second output circuit 58 applies the out of phase signal V2 to a second output terminal 18 via a second voltage follower transistor Q5 and applies the in-phase signal V1 to the second output terminal via a second current source transistor Q7.

Returning to the differential current source 51, recall that this source is a "keyed" source in that clamping the bases of transistors Q1 and Q2 will force the output currents I1 and I2 to zero. This is exactly what the tri-state control signal source does during tri-state operation. More specifically, the tri-state control circuit (transistors Q1,Q2), in the differential current source 51, is responsive to a first level (+1.7 V) of the control signal (S2) supplied thereto for enabling the differential current source (Q3,Q4) to produce the first and second complementary currents (I1, I2) whereby push pull output signals are produced at the output terminals (16,18). The tri-state control circuit (Q1 and Q2) is responsive to a second level (0 V) of the control signal S2 for inhibiting the differential current source from producing the first and second complementary currents I1 and I2 so as to enable the load circuits 52 and 54 to apply turn-off bias to the output transistors (Q5–Q8) for tri-stating (isolating) the output terminals 16 and 18.

Recall that in the overall system 5 of FIG. 1 that the twisted pair lines have a characteristic impedance of 120 Ohms. The output impedance of the tri-state bus driver 10 is adjusted to provide a differential output impedance of 120 Ohms and a single-ended output impedance of 60 Ohms by including a pair of series resistors RS1 and RS2 between the driver circuits 56 and 58 and the respective output terminals 16 and 18 for providing the desired output impedance. The overall gain of the bus driver 10 may be controlled by selection of the values of the emitter coupling resistor R3 which couples the emitters of differential amplifier transistors Q3 and Q4 together and the value of emitter coupling resistor R10 which couples the emitters of current source transistors Q7 and Q8 together.

In the specific embodiment of FIG. 1, with the exemplary element values shown, the bus driver 10 provides a nominal bandwidth on the order of 5 MHz or so and the ON impedance is nominally 60 Ohms each leg or 120 Ohms differential. The terminations comprise one 120 Ohm termination at each end of the bus for a net termination impedance of 60 Ohms differential. The signal levels are 1 volt peak-to-peak at the terminations and the common mode voltage is 6 volts nominal for a 12 volt supply voltage.

It will be noted that the signal voltage V1 produced at the collector of transistor Q4 of the differential current source is in-phase with the input signal voltage at input terminal 12 and produces an in-phase voltage at output terminal 16. The signal voltage V2 produced by the load network 54 at the collector of transistor Q3 is out-of-phase with the signal input voltage applied to input terminal 12. For this reason, input terminal 12 is designated in FIG. 1 as the driver non-inverting input terminal and terminal 14 is designated as the driver inverting input terminal, signal V1 is designated as being the "in-phase" signal and signal V2 is designated as being the "out-of-phase" signal. In the CLAIMS which follow, the terms "in-phase" and "out-of-phase" are defined as above.

Advantageously, in addition to consuming no power at all in the tri-state mode, the example of FIG. 1 exhibits unconditional stability with no tendency toward oscillations. Consequently, rapid video transients are easily handled by the system and transient artifacts, such as overshoots, are avoided.

Figure 2:
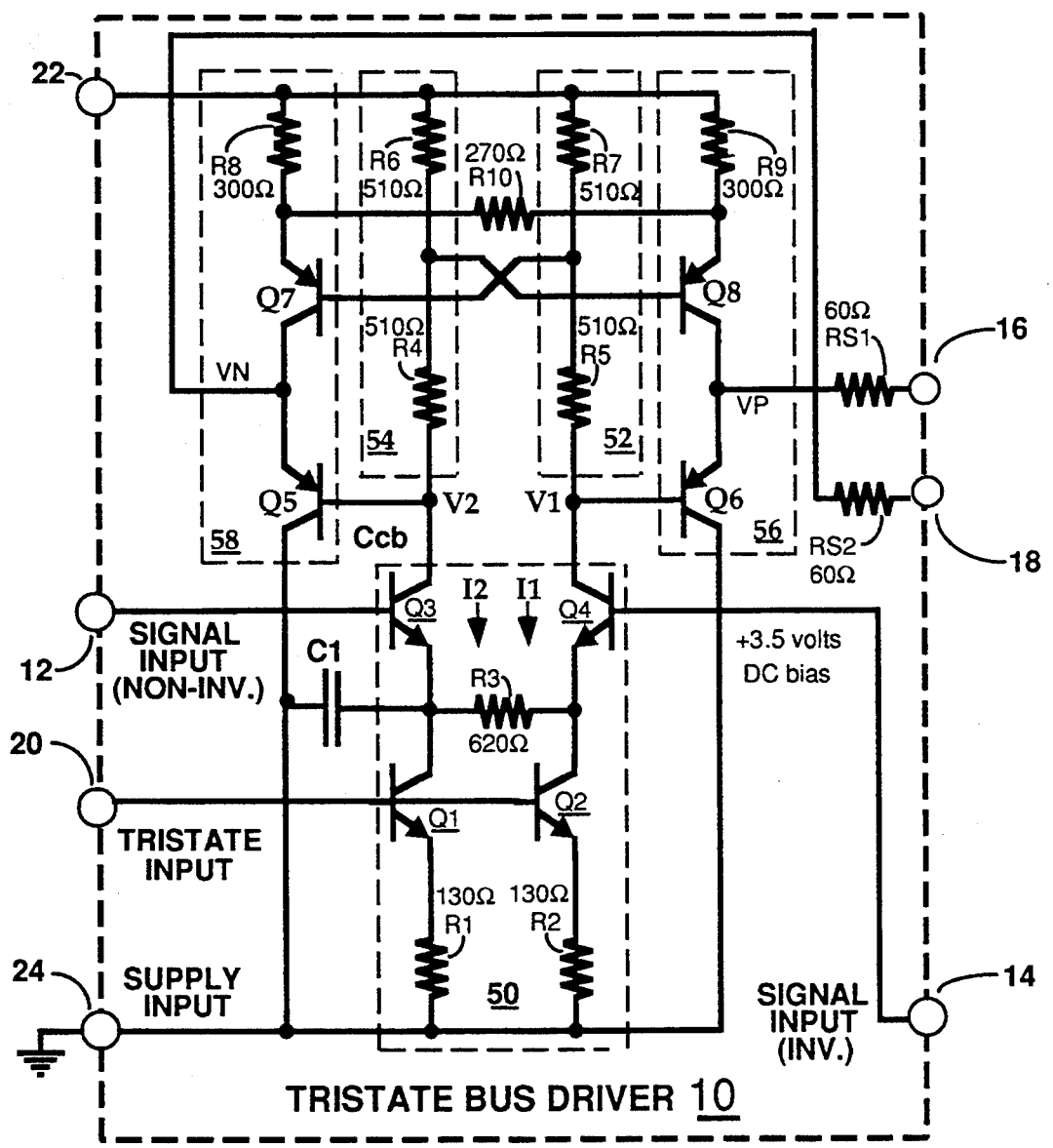
FIG. 2 is a detailed circuit diagram illustrating a modification of a tri-state balanced line driver used in the example of FIG. 1.

Various changes and modifications may be made to the example of FIG. 1. In FIG. 2, for example, for the case of a single-ended video source, a capacitor C1 has been added between the emitter of transistor Q3 of the differential current source 51 and ground. In more detail, it has been found that a high frequency limitation to the ideal differential output can occur with a single ended input (not differential input) drive signal as shown in FIG. 1. The collector to base capacitance of transistor Q3 can cause a high frequency current to flow directly into the collector of Q3 from the input signal at terminal 12. One can cancel this effect to a first approximation by adding the capacitor C1 from the emitter of transistor Q3 to AC ground, as shown in FIG. 2, selecting as a value for capacitor C1 the value of the effective collector to base capacitance, Ccb, of the transistor Q3. This added capacitor C1 creates a current in the emitter and hence collector of transistor Q3 of substantially equal amplitude but opposite phase. By using the configuration of Q1 and Q2 and arranging for the tri-state control signal to be of relative low AC impedance, the action of Ccb of Q3 is mostly cancelled by Ccb of transistor Q1 if the devices are similar. As in the previous example of the invention, the quiescent current is zero in the tri-state mode since all transistors are off and there is no current flow in any terminal. Accordingly, the quiescent power dissipation is zero.

Figure 3:
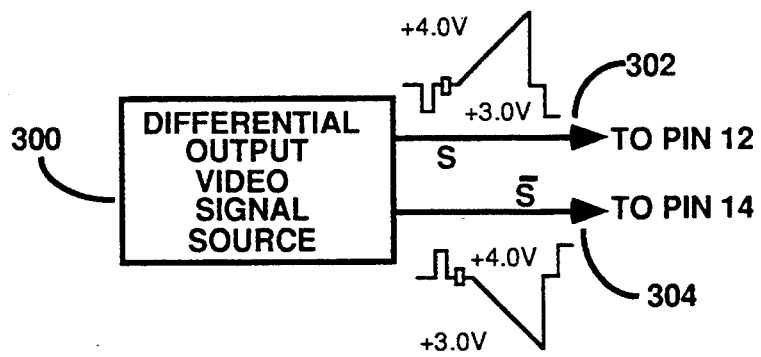
FIG. 3 is a simplified block diagram illustrating a modification of the system of FIG. 1.

Another change to the system of FIG. 1 is to provide differential drive to driver 10 rather than single-ended drive. This is shown in FIG. 3 wherein the baseband video signal source 30 and the bias source 32 have been deleted and replaced by a differential output base band video signal source 300 having output signals biased at the previous levels (e.g., 3.5 volts). Since this differential source configuration will double the overall gain (e.g., +6 dB) the driver gain setting resistors R10 and/or R3 may be adjusted for lower gain to compensate for the increase. As in the previous examples, there is zero quiescent power dissipation in the driver during tri-state operation since all the transistors are biased off and there are no other paths for current flow in the driver.

Figure 4:
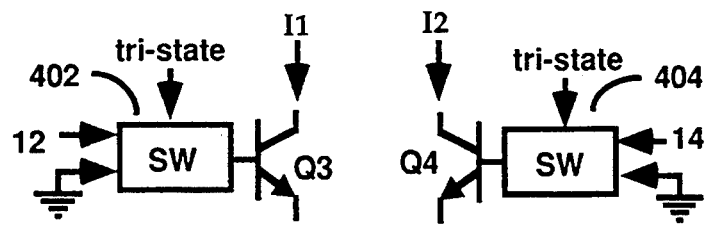
FIGS. 4, 5, 6 and 7 illustrate further modifications of the tri-state balanced line driver used in the system of FIG. 1.

Various other changes and modifications may be made to the example of FIG. 1 described above. For example, transistors Q1 and Q2 are not necessary for forcing the currents I1 and I2 to zero to achieve tri-state operation. In the alternative, for example, transistors or transmission gates may be used to force the base voltages of transistors Q3 and Q4 to zero rather than cutting off their emitter currents as shown. Such an arrangement is illustrated in FIG. 4 where switches 402 and 404 are used to ground the bases of transistors Q3 and Q4 to thereby force the collector currents I1 and I2 to zero for tri-state operation. This alternative, as in all of the previous examples of the invention has the advantage of reducing the driver 10 quiescent current to zero watts (no power dissipation) when in the tri-state (bus isolated) mode.

Figure 5:
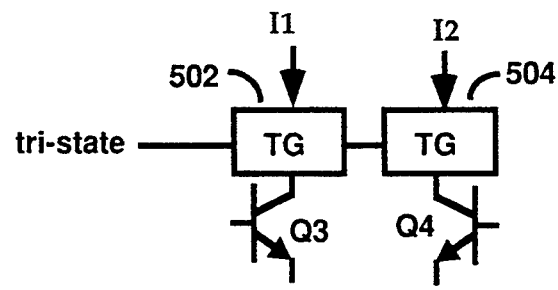

Another alternative would be to place transmission gates in the collector leads of transistors Q3 and Q4 for forcing the currents I1 and I2 to equal zero to provide tri-state operation as shown, illustratively, by added transmission gates 502 and 504 in FIG. 5. This alternative does not reduce the quiescent power dissipation to zero, as in the previous examples, but does reduce it to only the power dissipation of the differential current source 51, there is no power dissipation at all in either of the load circuits 52 and 54 or in the driver circuits 56 and 58. Other alternatives for forcing the differential output currents I1 and I2 to zero may be used. What is important, for purposes of the present invention, is that some suitable means be provided for forcing the differential output currents I1 and I2 to zero during tri-state operation. When this is done there can be no power dissipation at all in the load circuits or in the driver circuits and there can be no power dissipation in the differential current source either if the currents are suppressed as previously discussed with regard to FIGS. 1–4 and 6.

Figure 6:
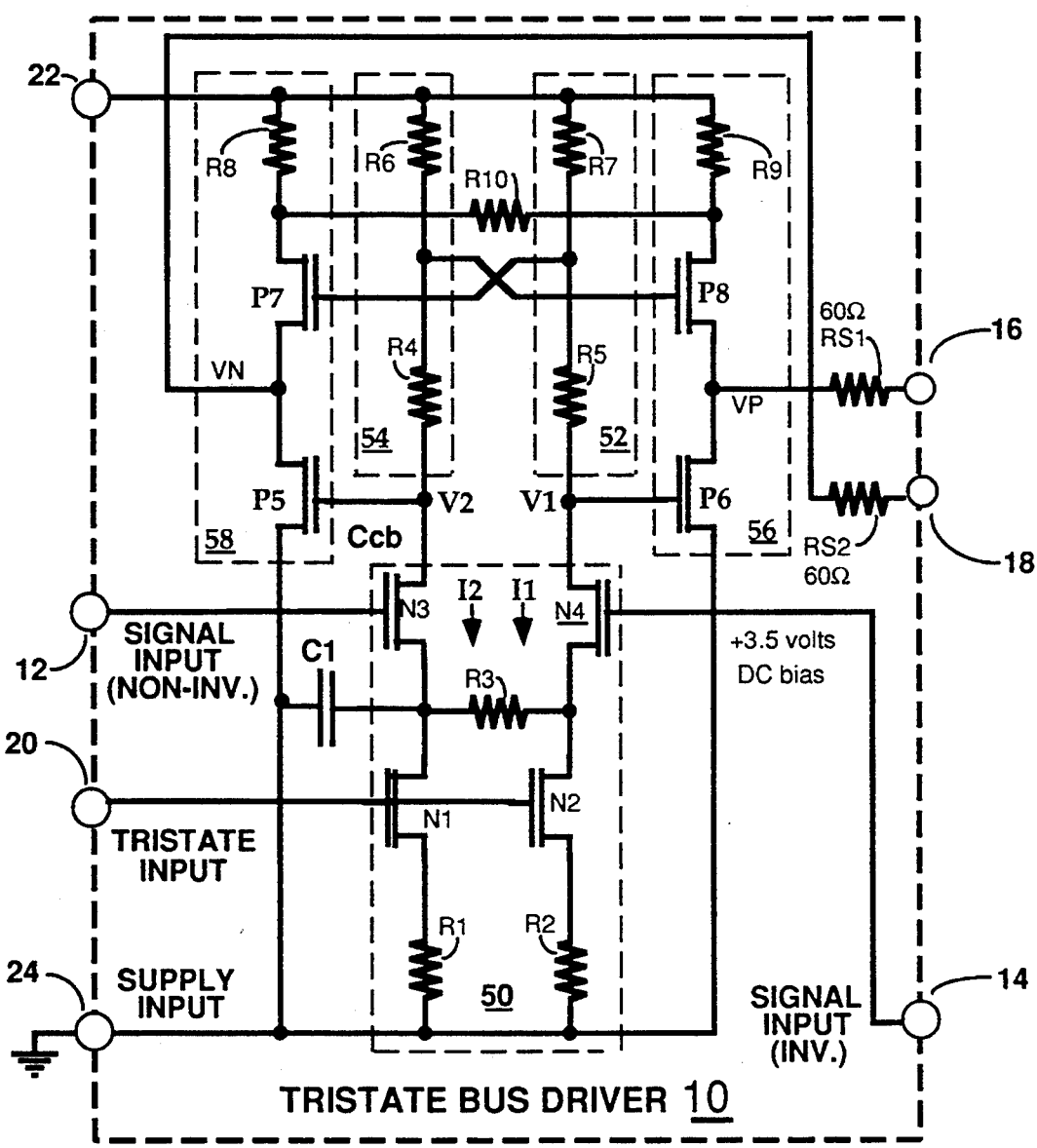

Other changes to the example of FIG. 1. For example, one may change the transistor types from bipolar to MOS as shown in FIG. 6. Specifically, in this example of the invention, the NPN bipolar transistors Q1–Q4 have been replaced by N-channel field effect transistors N1–N4 and the PNP bipolar transistors Q5–Q8 have been replaced by P-channel transistors P5–P8. Owing to the generally lower transconductances of MOS transistors, the resistance values may be appropriately scaled.

Another desirable modification may be called for in certain applications where bipolar transistors are used as the voltage follwer transistors Q5 and Q6 and wherein relatively large voltage changes may be encountered which might exceed the Vber rating (reverse bias base-emitter breakdown voltage) of the output transistors Q5 and Q6. If, for example, an output terminal is accidentally shorted to ground and the voltage driver transistor is biased at a voltage above the maximum Vber rating of the transistor, then reverse bias breakdown of the base-emitter junction may occur. Transistors which have been stressed in that way may exhibit a permanent increase in noise level. Such a potential problem may be avoided by either selecting voltage driver transistors Q5 and Q6 to have an adequately large Vber for the expected faults or transients. If, however, such a transistor is not available, Vber protection may be realized by inserting diodes in series with their emitter leads of the voltage follower transistors as shown in FIG. 7.

Figure 7:
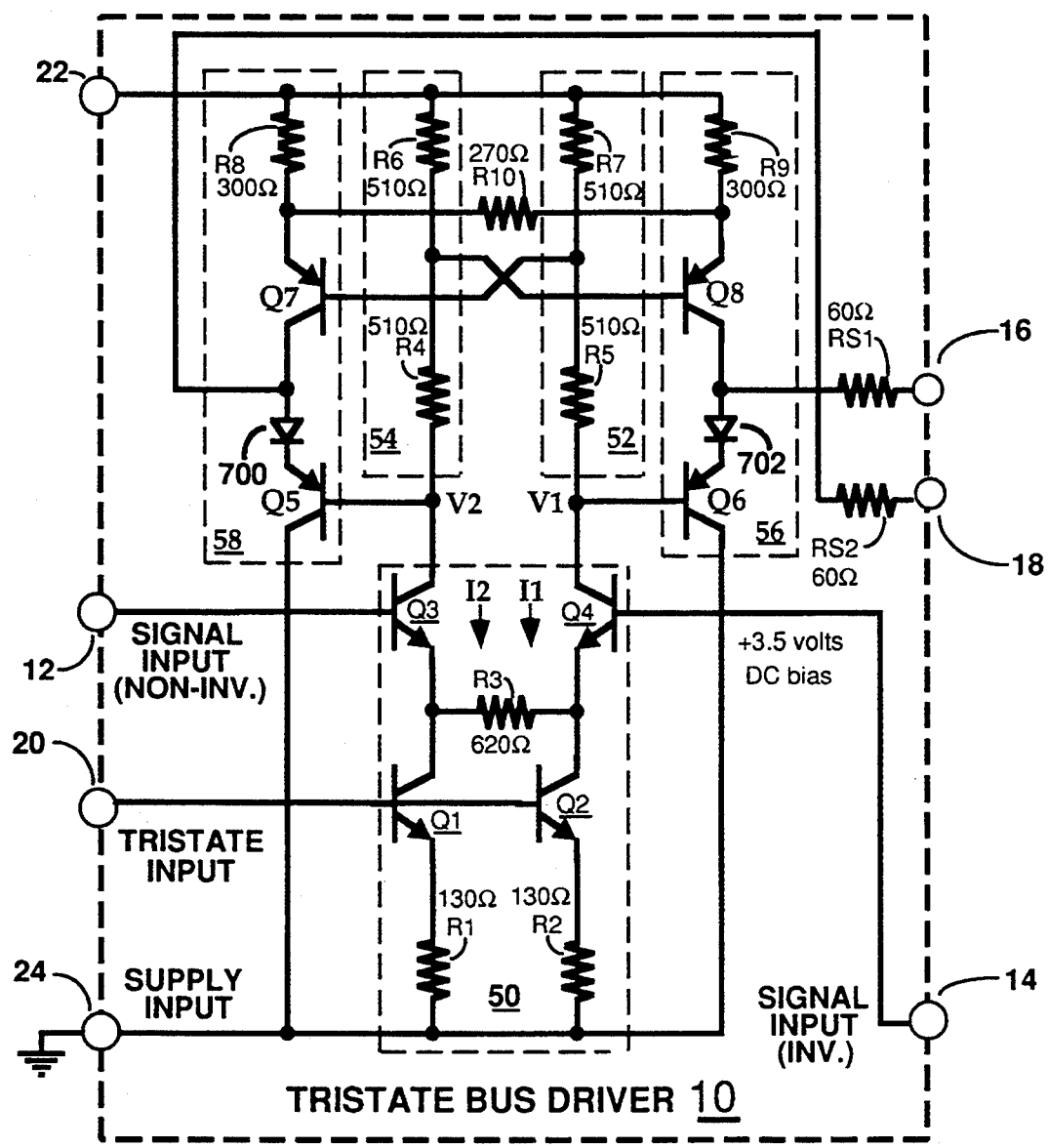

In more detail, in FIG. 7 a Vber protection diode 700 has been inserted in series with the emitter lead of transistor Q5 and a Vber protection diode 702 has been inserted in series with the emitter lead of transistor Q6. The diodes are poled to conduct current in the same direction as the transistors. Accordingly, if one accidently shorts output 16 to ground, the diode 702 will be reverse biased thereby preventing Vber breakdown of transistor Q6. Likewise, if terminal 18 is shorted to ground diode 700 will be reverse biased thereby providing Vber protection for the voltage follower transistor Q5.

What is claimed is:

1. Video tri-state bus driver apparatus, comprising:
   a differential current source for deriving first and second complementary currents from a video input signal;
   a first load network for developing a first video output signal from the first current and a second load network for developing a second video output signal from the second current;
   a first output circuit for applying the first video output signal to a first output terminal via a first voltage follower transistor and for applying the second video output signal to the first output terminal via a first current source transistor;
   a second output circuit for applying the second video output signal to a second output terminal via a second voltage follower transistor and for applying the first video output signal to the second output terminal via a second current source transistor; and
   a tri-state control circuit responsive to a tri-state control signal supplied thereto for enabling and inhibiting the first and second currents.

2. Apparatus as recited in claim 1 wherein said tri-state control circuit is of a type dissipating no power when inhibiting said first and second complementary currents.

3. Apparatus as recited in claim 1 wherein said tri-state control circuit comprises a pair of current source transistors responsive to said tri-state control signal supplied thereto for interrupting first and second operating currents supplied to said differential current source for forcing said first and second complementary currents to zero.

4. Apparatus as recited in claim 1 wherein said tri-state control circuit comprises a pair of switches arranged to ground first and second inputs of said differential current source for forcing said first and second complementary currents to zero during tri-state operation.

5. Apparatus as recited in claim 1 wherein said tri-state control circuit comprises a pair of switches connected to respective outputs of said differential current source for forcing said first and second complementary currents to zero during tri-state operation.

6. Apparatus as recited in claim 1 wherein:
   said differential current source includes two bipolar input transistors and further comprising a capacitor connected from an emitter electrode of one transistor to AC ground, there being no corresponding capacitor coupled to the emitter electrode of the other transistor.

7. Apparatus as recited in claim 1 wherein said first voltage follower transistor, said first current source transistor, said second voltage follower transistor and said second current source transistor are of a common transistor type.

8. Apparatus as recited in claim 1 wherein:
said differential current source comprises a pair of emitter or source coupled transistors for providing said first and second complementary currents; and
said tri-state control circuit includes a pair of transistors coupled between respective ones of said emitter or source electrodes to a supply voltage source and having commonly connected control electrodes for receiving said tri-state control signal.

9. A tri-state video bus driver for balanced lines, comprising:
a differential current source responsive to a video input signal for providing a pair of complementary output currents representative thereof;
a pair of load networks, connected between a supply voltage source and respective outputs of the differential current source and responsive to respective ones of the complementary output currents for developing a first output signal at one load network and a complementary second output signal at the other network;
a first output circuit for applying the first output signal to a first output terminal via a first PNP voltage follower transistor and for applying the second output signal to the first output terminal via a first PNP current source transistor;
a second output circuit for applying the second output signal to a second output terminal via a second PNP voltage follower transistor and for applying the first output signal to the second output terminal via a second PNP current source transistor; and
a tri-state control circuit, coupled to the differential current source for enabling the differential current source in response to a first level of a tri-state control signal supplied thereto for causing the first and second current source transistors and the first and second voltage follower transistors to produce push-pull output signals at the first and second output terminals;
said tri-state control circuit being responsive to a second level of the control signal for disabling the differential current source so as to enable the load networks to bias all of the transistors off with bias provided by said supply voltage source for electrically isolating the output terminals.

10. A method of providing tri-state video bus driving, comprising:
deriving (Q3,Q4) first and second complementary currents (I1,I2) from a video input signal (S1);
developing an in-phase signal (V1) in a first load circuit (52) from the first current and an out-of-phase signal (V2) in a second load circuit (54) from the second current;
applying the in-phase signal (V1) to first output terminal (16) via a first voltage follower transistor (Q6) and to a second output terminal via a first current source transistor (Q7);
applying the out-of-phase signal (V2) to the second output terminal (18) via a second voltage follower transistor (Q5) and to the first output terminal (16) via a second current source transistor(Q8); and
enabling the first and second complementary currents (I1, I2) for causing said first voltage follower transistor, said first current source transistor, said second voltage follower transistor and said second current source transistor to produce push-pull output signals at the output terminals; and
disabling the first and second complementary currents for applying turn-off bias to said first voltage follower transistor, said first current source transistor, said second voltage follower transistor and said second current source transistor via the load circuits so as to isolate the output terminals.

* * * * *